US009494756B2

United States Patent
Anderson et al.

(10) Patent No.: US 9,494,756 B2
(45) Date of Patent: Nov. 15, 2016

(54) HOLE SEAL FOR AN ENCLOSURE

(71) Applicant: Hoffman Enclosures, Anoka, MN (US)

(72) Inventors: William Anderson, Anoka, MN (US); Joseph D. Ricke, Arden Hills, MN (US); Joseph M. Stark, Chanhassen, MN (US)

(73) Assignee: Hoffman Enclosures, Inc., Anoka, MN (US)

( * ) Notice: Subject to any disclaimer, the term of this patent is extended or adjusted under 35 U.S.C. 154(b) by 0 days.

(21) Appl. No.: 14/606,889

(22) Filed: Jan. 27, 2015

(65) Prior Publication Data

US 2016/0216469 A1    Jul. 28, 2016

(51) Int. Cl.
*G02B 6/44* (2006.01)
*B65D 43/02* (2006.01)
*F17C 13/06* (2006.01)

(52) U.S. Cl.
CPC ......... *G02B 6/4444* (2013.01); *B65D 43/0214* (2013.01); *F17C 13/06* (2013.01)

(58) Field of Classification Search
CPC ............ G02B 6/4444; B65D 43/0214; B65D 4/0202; B65D 4/02; B65D 45/10; B65D 45/02; B65D 51/14; F17C 13/06; F16J 13/02
USPC ....... 220/806, 804, 801, 803, 802, 582, 581, 220/328, 327, 242, 241; 215/364, 355, 354, 215/283, 280, 273; 277/637, 628
See application file for complete search history.

(56) References Cited

U.S. PATENT DOCUMENTS

| 2,298,511 | A | * | 10/1942 | Rathbun | F16J 15/0881 |
| | | | | | 165/158 |
| 2,922,542 | A | * | 1/1960 | Barr | F16J 13/02 |
| | | | | | 219/99 |
| 3,447,712 | A | | 6/1969 | Galasso et al. | |
| 3,688,941 | A | * | 9/1972 | Christian | H01F 27/02 |
| | | | | | 220/327 |
| 3,858,752 | A | * | 1/1975 | Marvin, Jr. | B65D 11/188 |
| | | | | | 220/325 |
| 5,358,429 | A | | 10/1994 | Mina | |
| 5,740,935 | A | | 4/1998 | Desfarges | |
| 6,075,206 | A | | 6/2000 | Walker | |
| 6,662,490 | B1 | | 12/2003 | Aesch | |
| 6,809,263 | B2 | | 10/2004 | Jackson | |
| 7,288,719 | B2 | | 10/2007 | Barnhard et al. | |
| 7,464,727 | B1 | | 12/2008 | Larson et al. | |
| 7,518,062 | B2 | | 4/2009 | Nepsha et al. | |
| 2006/0065178 | A1 | | 3/2006 | Nysether et al. | |
| 2012/0221024 | A1 | | 8/2012 | Sutton et al. | |

FOREIGN PATENT DOCUMENTS

| CN | 203638050 U | 6/2014 | | |
| EP | 1127810 | 8/2001 | | |
| GB | 769216 A | * | 3/1957 | ............... B01J 3/03 |
| WO | 2009095695 | 6/2009 | | |

* cited by examiner

*Primary Examiner* — Robert J Hicks
(74) *Attorney, Agent, or Firm* — Quarles & Brady LLP

(57) ABSTRACT

Hole seals for enclosures that are located in a hazardous locations where flammable gases or vapors may exist and methods for installing hole seals. In an embodiment, a hole seal includes a first retaining plate, a gasket, and a second retaining plate. The hole seal further includes a fastener to tighten the first retaining plate and gasket against the second retaining plate.

19 Claims, 3 Drawing Sheets

HOLE SEAL FOR AN ENCLOSURE

BACKGROUND OF THE INVENTION

In many applications, it is necessary to place an enclosure in locations where flammable gases or vapors exist. For example, a worker may be surrounded by atmospheric conditions conducive to danger. An oxygen rich atmosphere might be particularly conducive to flash fire caused by a stray spark. A similar condition could exist in a dust laden atmosphere or in an atmosphere that includes flammable gases or vapors. At such locations, it is necessary to provide protection against the ignition of flammable gases or vapors, in order to prevent the occurrence of explosions.

Electrical enclosures can be used to house assorted electrical and datacom equipment. The enclosure protects the electrical equipment from the environment and helps prevent unauthorized access to the equipment. Hole seals are used to cover holes in the enclosure. The holes are used to feed electrical lines or other equipment into and out of the enclosure. When not being used, the hole needs to be sealed to prevent flammable gases or vapors from entering the enclosure through the hole.

In the past, hole seals consisted of an outer body having an outer portion that would extend a distance beyond the surface of the enclosure. However, these hole seals were not suitable for use in hazardous locations. Therefore, there is a need for a hole seal with a hazardous location rating.

SUMMARY OF THE INVENTION

The present disclosure relates to the field of electrical enclosures, and more specifically to a hole seal for an enclosure that is located in a hazardous location where flammable gases or vapors may exist. In particular, the present disclosure relates to a hole seal which can prevent these flammable gases or vapors from passing through a hole opening and igniting with any sparking components which may be located within an enclosure.

Embodiments of the disclosure provide a seal for an enclosure for use in a hazardous environment, the seal comprising a first retaining plate having at least one stud, a second retaining plate having at least one first opening, a compressible gasket assembly positioned between the first retaining plate and the second retaining plate comprising at least one second opening, an outer edge portion and a depression formed along the outer edge, at least one fastener having at least one third opening, wherein the at least one fastener can tighten the first retaining plate and gasket against the second retaining plate, and at least one passageway extending in alignment through the second retaining plate, the compressible gasket, and the at least one fastener.

Embodiments of the disclosure also provide a hole seal for an enclosure for use in a hazardous environment, the hole seal comprising a circular first retaining plate having a first surface and a second surface, at least one cylindrical stud extending from the second surface, a circular second retaining plate having a first surface, a second surface, and a circular first opening configured to accept the at least one cylindrical stud, a circular gasket having a circular second opening, and a fastener having a circular third opening configured to accept the at least one cylindrical stud of the circular first retaining plate.

Embodiments of the disclosure also provide a method for installing a seal into an enclosure in a hazardous environment, the enclosure including a wall, the method comprising the steps of placing at least one stud of a first retaining plate through at least one opening of a gasket, locating a depression on an outer edge of the gasket and inserting an outer flange of the first retaining plate into the depression of the gasket, placing the first retaining plate and gasket against a first side of the wall, placing a second retaining plate around the at least one stud of the first retaining plate, placing the second retaining plate against a second side of the wall, engaging at least one fastener with the at least one stud to apply a compressive force against the first and second retaining plates against the wall.

These and other features, aspects, and advantages of the present invention will become better understood upon consideration of the following detailed description, drawings, and appended claims.

DETAILED DESCRIPTION OF THE DRAWINGS

Figure 1:
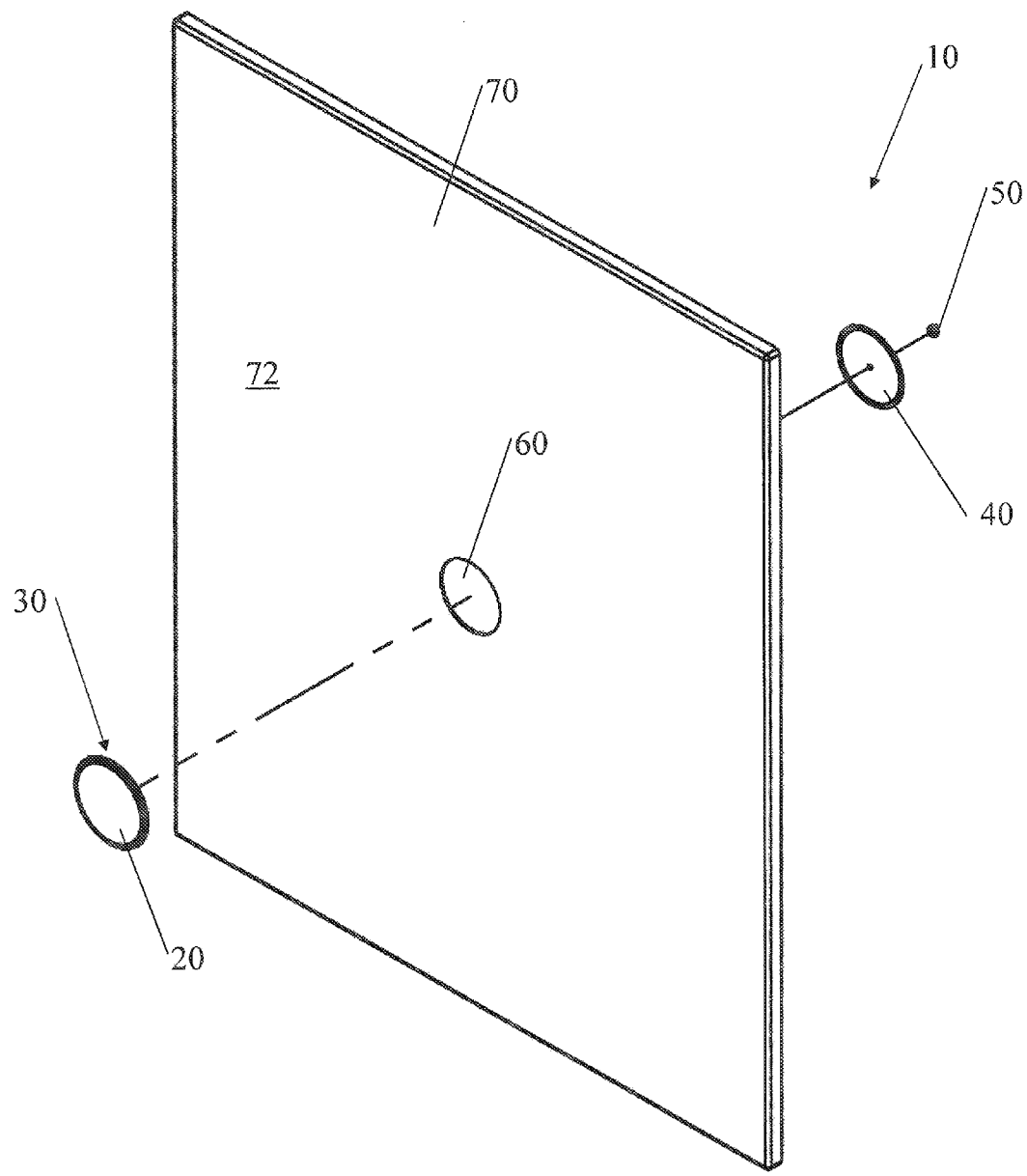
FIG. 1 is a perspective view of one embodiment of a hole seal.

Before any embodiments of the invention are explained in detail, it is to be understood that the invention is not limited in its application to the details of construction and the arrangement of components set forth in the following description or illustrated in the following drawings. The invention is capable of other embodiments and of being practiced or of being carried out in various ways. Also, it is to be understood that the phraseology and terminology used herein is for the purpose of description and should not be regarded as limiting. The use of "including," "comprising," or "having" and variations thereof herein is meant to encompass the items listed thereafter and equivalents thereof as well as additional items. Unless specified or limited otherwise, the terms "connected," and "coupled" and variations thereof are used broadly and encompass both direct and indirect mountings, connections, supports, and couplings. Further, "connected" and "coupled" are not restricted to physical or mechanical connections or couplings.

The following discussion is presented to enable a person skilled in the art to make and use embodiments of the invention. Various modifications to the illustrated embodiments will be readily apparent to those skilled in the art, and the generic principles herein can be applied to other embodiments and applications without departing from embodiments of the invention. Thus, embodiments of the invention are not intended to be limited to embodiments shown, but are to be accorded the widest scope consistent with the principles and features disclosed herein. The following detailed description is to be read with reference to the figures, in which like elements in different figures have like reference numerals. The figures, which are not necessarily to scale, depict selected embodiments and are not intended to limit the scope of embodiments of the invention. Skilled artisans will recognize the examples provided herein have many useful alternatives and fall within the scope of embodiments of the invention.

FIG. 1 illustrates one embodiment of a hole seal 10 for use in a hazardous environment. In one embodiment, the hole seal 10 is capable to achieving an IP66 rating in an increased safety hazardous location. The IP66 rating is a rating from the IP Code, published by the International Electrotechnical Commission, which classifies and rates the degree of protection provided against intrusion of dust, accidental contact, and/or water by mechanical casings and electrical enclosures. An IP66 rating provides complete protection against the ingress of dust or water projected from powerful jets (e.g. 12.5 mm nozzles) from entering an enclosure from any direction.

In one embodiment, the hole seal 10 can be made of a first retaining plate 20, a gasket 30, a second retaining plate 40, and a fastener 50. The hole seal 10 can be used to seal off an opening 60 within a wall 70 of a structure such as a housing or electrical enclosure. One or more openings 60 can be located in any wall 70 of a housing. These openings 60 can be used to route cables, conduits or any other desirable object through a wall 70 of a housing. The wall 70 can be formed of sheet metal, plastic or other materials known in the art.

In this embodiment, the opening 60 is circular and the retaining plates 20, 40 and the gasket 30 are circular in shape to match the geometric dimensions of the opening 60. However, the retaining plates 20, 40 and the gasket 30 can be formed in any size or shape suitable to seal off an opening 60. The retaining plates 20, 40 can be made of stainless steel or other suitable materials to satisfy a hazardous location rating according to ATEX or IECex certification standards.

Figure 2:
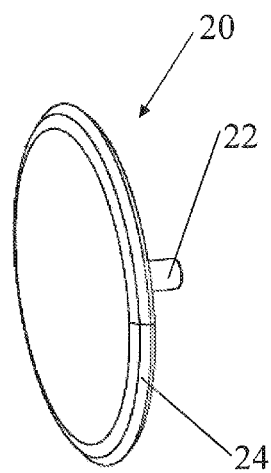
FIG. 2 is a perspective view of one embodiment of a first retaining plate.

FIG. 2 illustrates one embodiment of a first retaining plate 20. The first retaining plate 20 has an outer diameter that is larger than the diameter of the opening 60. This ensures that the first retaining plate 20 will be able to completely cover opening 60 to prevent hazardous gases or vapors from passing through opening 60. The first retaining plate 20 can include a stud 22. In one embodiment, the stud 22 is cylindrical in shape and is centered on the first retaining plate 20. However, the stud 22 can be located anywhere on the first retaining plate 20. The stud 22 can include threads located on an outer surface of the stud 22 to allow the stud 22 to engage with a fastener 50 having threads. The first retaining plate 20 can have an outer, angled flange 24 on its outer peripheral edge. In one embodiment, this outer flange 24 is angled approximately thirty degrees with respect to the wall 70.

Figure 3:
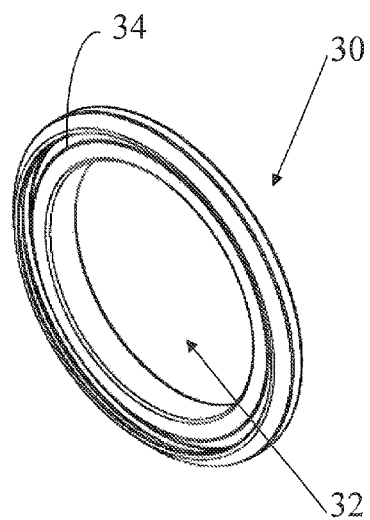
FIG. 3 is a perspective view of one embodiment of a gasket.

FIG. 3 illustrates one embodiment of a gasket 30. The gasket 30 can be a separate component or the gasket 30 can be integral with first retaining plate 20. The gasket 30 is preferably made of an elastomeric material such as a silicone material or other material suitable to maintain a hazardous location rating for the hole seal 10. In one embodiment, the gasket 30 is shaped like a ring and includes at least one opening 32. The opening 32 is sized to at least accept the stud 22 of the first retaining plate 20. The opening 32 is located on the gasket 30 in a position that allows the gasket 30 to be coupled with first retaining plate 20 while also allowing the opening 32 to line up with stud 22 of first retaining plate 20.

The gasket 30 can also include a depression 34 located near an outer edge portion of the gasket 30. The depression 34 is configured to accept the outer flange 24 of the first retaining plate 20. The outer flange 24 can be coupled with the depression 34 to cause the first retaining plate 20 to be automatically centered with respect to gasket 30, when the gasket 30 and first retaining plate 20 are mated together. The depression 34 has a lip which allows it to wrap around and cover the outer flange 24.

Figure 4:
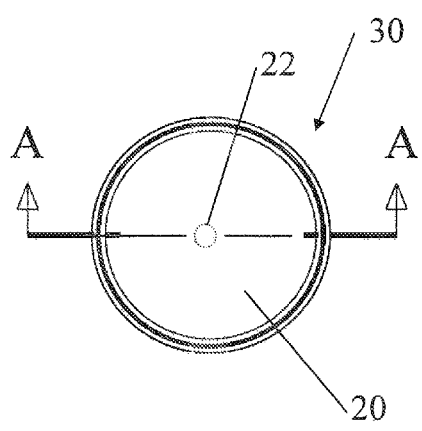
FIG. 4 is a top view showing the gasket of FIG. 3 installed within the first retaining plate of FIG. 2.

FIG. 4 illustrates a top view of a first retaining plate 20 coupled to a gasket 30, according to one embodiment. In one embodiment, the stud 22 can be centered on the first retaining plate 20. However, the stud 22 can also be offset from center in a single stud configuration or in a multiple stud configuration.

Figure 5:
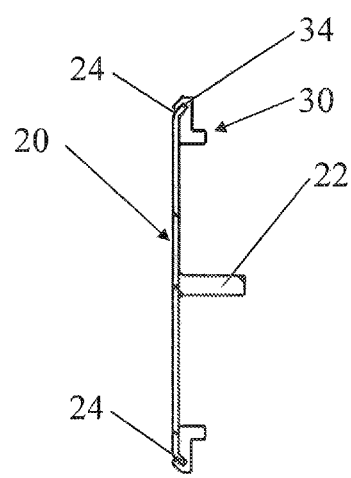
FIG. 5 is a side, cross sectional view of the gasket and first retaining plate of FIG. 4 taken along section line A-A.

FIG. 5 illustrates a cross sectional view of the first retaining plate 20 and the gasket 30 coupled together and taken along section line A-A of FIG. 4. The cross sectional view illustrates how the angled flange 24 of the first retaining plate 20 can be coupled to the depression 34 in the first retaining plate 20. This view also illustrates on embodiment of how a lip of the depression can wrap around the outer flange 24 portion of the first retaining plate 20.

Figure 6:
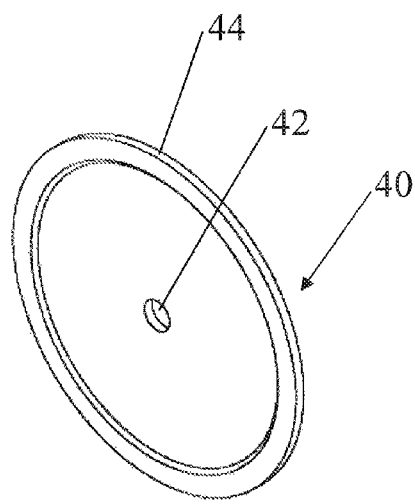
FIG. 6 is a perspective view of one embodiment of a second retaining plate.

FIG. 6 illustrates one embodiment of a second retaining plate 40. The second retaining plate 40 can have an opening 42 that is sized to accept stud 22. The opening 42 can have approximately the same diameter as the diameter of the stud 22 of the first retaining plate 20. In one embodiment, the second retaining plate 40 has an angled outer peripheral edge 44 that is configured to interface with the gasket 30. In another embodiment, the second retaining plate 40 can include a threaded opening that is configured to cooperate with the stud 22 of the first retaining plate 20. The second retaining plate 40 having a threaded opening can be configured to allow a user to tighten the second retaining plate 40 against the wall 70 and the first retaining plate 20.

Figure 7:
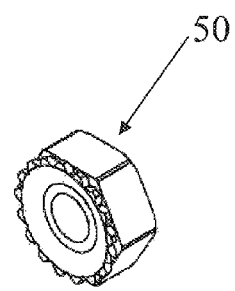
FIG. 7 is a perspective view of a fastener.
Figure 8:
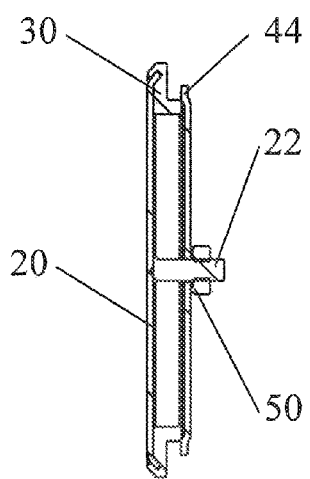
FIG. 8 is a side, cross sectional view of a gasket installed between a first and second retaining plate, and held in place by a fastener.

FIG. 7 illustrates one embodiment of a fastener 50 that is configured to couple with stud 22 of the first retaining plate 20. The fastener 50 has an opening with threads located on the inner surface of the faster 50. The internal threads of the fastener 50 are configured to couple with threads located on an outer surface of the stud 22. The threads of the fastener 50 and the stud 22 cooperate to allow a user to draw the fastener 50 closer to the stud 22 to create a tight seal between the first retaining plate 20 and second 40 retaining plate, and the wall 70, respectively. In one embodiment, the fastener 50 can be a hex nut, but it should be understood to one of ordinary skill in the art that various other fasteners would be suitable. For example, the fastener 50 can be a nut such as a wing nut or flange nut.

In order to install a hole seal 10 within an opening 60, a user first places attaches a gasket 30 to a first retaining plate 20. In one embodiment, this step requires that a user insert the angled flange 24 of the first retaining plate 20 into a depression 34 in the gasket 30. The angled flange 24 is covered in the radial direction by the gasket 30. When attaching the gasket 30 to the first retaining plate 20, the stud 22 of the first retaining plate 20 should also be inserted through the opening 32 of gasket 30. Once the gasket 30 is installed within first retaining plate 20, a user can then place the first retaining plate 20 and gasket 30 against the opening 60 on a first side 72 of wall 70. The first retaining plate 20 and gasket 30 should completely cover opening 60.

To continue installing the hole seal 10 within the opening 60, a user places the stud 22 into the opening 60. In one embodiment, the stud 22 has a male threaded portion that can extend at least partially through the opening 60. In order to completely seal the opening 60 from the opposite side of the wall 70, a second retaining plate 40 can be provided and located on a second side of the wall 70. The second retaining plate 40 has an opening 42 which is sized to accept the stud 22. A user can place the second retaining plate 40 against the second side of the wall 70 by locating the stud 22 and inserting it through the opening 42 in the second retaining plate 40.

Next, the user can locate a fastener 50 to interface with the stud 22. Thus, there can be a passageway which extends in alignment through the second retaining plate 40, the compressible gasket 30, and the fastener 50. In one embodiment, when a user places the stud 22 into opening 60, the stud 22 has a male threaded portion on its end. The threaded portion of the stud 22 can extend at least partially through the opening 60 when the first retaining plate 20 is placed flush against the wall 70. The threaded portion of the stud 22 can also extend through the second opening 42 of the second retaining plate 40 after the second retaining plate 40 has been placed against the second side of the wall 70.

The fastener 50 can be a female threaded nut which can engage the threaded portion of the stud 22. The user can apply an axial force, rotational force, or combination of both to bring the fastener 50 closer to the first retaining plate 20 and second retaining plate 40. Both the stud 22 and the fastener 50 are threadingly engaged so that as fastener 50 is tightened, the fastener 50 applies an axial force against both the first retaining plate 20 and the second retaining plate 40, drawing each closer to the wall 70. As the user tightens the fastener 50, the gasket 30 gets more compressed in response to the first retaining plate 20 and the second retaining plate 40 drawing closer to the wall 70. As long as the fastener 50 is tightly bound to the stud 22 in its locked position, the gasket 30 will remain in a compressed state. By being compressed against the wall and the first retaining plate 20 and the second retaining plate 40, the gasket 30 helps to maintain an airtight seal against the opening 60 in the enclosure wall 70.

While the above description contemplates a hole seal 10 having a single stud 22 inserted through a single hole in the first retaining plate 20, the gasket 30 and the second retaining plate 40, the hole seal 10 can alternatively include a first retaining plate 20 that has multiple studs 22 that each engage separate fasteners 50. In order to accommodate multiple studs, the gasket 30 and the second retaining plate 40 can each have multiple openings 32, 42 respectively.

It is understood that the above description is intended to be illustrative, and not restrictive. Many other embodiments will be apparent to those of skill in the art upon reviewing the above description. The scope of the invention should, therefore, be determined with reference to the appended claims, along with the full scope of equivalents to which such claims are entitled.

We claim:

1. A seal for an enclosure for use in a hazardous environment, the seal comprising:
    a first retaining plate having at least one stud and a flange;
    a second retaining plate having at least one first opening;
    a compressible gasket assembly positioned between the first retaining plate and the second retaining plate comprising:
        at least one second opening
        an outer edge portion and a depression formed along the outer edge portion, the depression covering the flange;
    at least one fastener having at least one third opening, wherein the at least one fastener can tighten the first retaining plate and gasket against the second retaining plate; and
    at least one passageway extending in alignment through the second retaining plate, the compressible gasket, and the at least one fastener.

2. The seal of claim 1 wherein the at least one stud is centered on the first retaining plate.

3. The seal of claim 1 wherein the at least one stud has a threaded outer surface and the fastener has a threaded inner surface.

4. The seal of claim 1 wherein the compressible gasket assembly is integral with the first retaining plate.

5. The seal of claim 1 wherein the first retaining plate further comprises an angled flange located around an outer peripheral edge of the first retaining plate.

6. The seal of claim 5 wherein the compressible gasket assembly further comprises a depression on an outer edge of the gasket assembly wherein the depression is configured to couple with the angled flange of the first retaining plate.

7. The seal of claim 1 wherein the fastener is a nut.

8. The seal of claim 1 wherein the at least one first opening of the second retaining plate has a first diameter and the at least one stud of the first retaining plate has a second diameter, and further wherein the first diameter and the second diameter are substantially the same diameter.

9. A hole seal for an enclosure for use in a hazardous environment, the hole seal comprising:
    a circular first retaining plate having a first surface, a second surface opposite the first surface, a flange, and at least one cylindrical stud extending from the second surface;
    a circular second retaining plate having a first surface, a second surface opposite the first surface of the second retaining plate, and a circular first opening configured to accept the at least one cylindrical stud;
    a circular gasket having a circular second opening, the circular gasket including an outer edge portion, at least a portion of which covers the flange; and
    a fastener having a circular third opening configured to accept the at least one cylindrical stud of the circular first retaining plate.

10. The seal of claim 9 wherein the at least one cylindrical stud is centered on the circular first retaining plate.

11. The seal of claim 9 wherein the at least one cylindrical stud has a threaded outer surface and the fastener has a threaded inner surface.

12. The seal of claim 9 wherein the circular gasket is integral with the circular first retaining plate.

13. The seal of claim 9 wherein the circular first retaining plate further comprises an angled flange located around an outer peripheral edge of the circular first retaining plate.

14. The seal of claim 13 wherein the circular gasket comprises a depression sized to interface with the angled flange of the circular first retaining plate.

15. The seal of claim 9 wherein the fastener is a nut.

16. The seal of claim 9 wherein the opening of the circular second retaining plate has a first diameter and the at least one cylindrical stud of the circular first retaining plate has a second diameter, and further wherein the first diameter and the second diameter are approximately the same.

17. A method for installing a seal into an enclosure in a hazardous environment, the enclosure including a wall, the method comprising the steps of:
    placing at least one stud of a first retaining plate through at least one opening of a gasket;
    locating a depression on an outer edge of the gasket and inserting an outer flange of the first retaining plate into the depression of the gasket;

placing the first retaining plate and gasket against a first side of the wall;

placing a second retaining plate around the at least one stud of the first retaining plate;

placing the second retaining plate against a second side of the wall; and engaging at least one fastener with the at least one stud to apply a compressive force against the first and second retaining plates against the wall.

18. The seal of claim 1, wherein the outer flange is angled, and the depression covers the angled outer flange.

19. The seal of claim 1, wherein the depression includes a lip, the lip wrapping around the outer flange.

* * * * *